(12) United States Patent
Jang et al.

(10) Patent No.: US 7,850,943 B2
(45) Date of Patent: Dec. 14, 2010

(54) METHOD OF PREPARING CADMIUM SULFIDE NANOCRYSTALS EMITTING LIGHT AT MULTIPLE WAVELENGTHS, AND CADMIUM SULFIDE NANOCRYSTALS PREPARED BY THE METHOD

(75) Inventors: Eun Joo Jang, Suwon-si (KR); Shin Ae Jun, Seongnam-si (KR); Tae Kyung Ahn, Seoul (KR); Sung Hun Lee, Seoul (JP); Seong Jae Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/320,416

(22) Filed: Jan. 26, 2009

(65) Prior Publication Data
US 2009/0239074 A1  Sep. 24, 2009

Related U.S. Application Data

(63) Continuation-in-part of application No. 12/219,434, filed on Jul. 22, 2008, now Pat. No. 7,658,905, which is a continuation of application No. 11/002,490, filed on Dec. 3, 2004, now Pat. No. 7,468,168.

(30) Foreign Application Priority Data
May 28, 2004  (KR) ............... 10-2004-0038392

(51) Int. Cl.
*C01G 99/00* (2010.01)
(52) U.S. Cl. ............... 423/561.1; 423/99; 423/101; 423/566.1; 977/773; 977/775; 313/503; 252/301.4 S; 362/800; 257/798

(58) Field of Classification Search ............... 423/99, 423/101, 561.1, 566.1; 977/773, 775; 313/503; 252/301.4 S; 362/800; 257/798
See application file for complete search history.

(56) References Cited

U.S. PATENT DOCUMENTS

| | | | |
|---|---|---|---|
| 6,207,229 B1 | 3/2001 | Bawendi et al. |
| 6,225,198 B1 | 5/2001 | Alivisatos et al. |
| 6,306,736 B1 | 10/2001 | Alivisatos et al. |
| 6,322,901 B1 | 11/2001 | Bawendi et al. |

(Continued)

FOREIGN PATENT DOCUMENTS

| | | |
|---|---|---|
| JP | 2005-521755 A | 7/2005 |
| WO | 03/050329 A2 | 6/2003 |

OTHER PUBLICATIONS

W. William Yu et al., "Formation of High-Quality CdS and Other II-VI Semiconductor Nanocrystals in Noncoordinating Solvents: Tunable Reactivity of Monomers" Angewandte Chemie International Edition, vol. 41, Issue 13 (Jul. 3, 2002), pp. 2368-2371.

(Continued)

*Primary Examiner*—Timothy C Vanoy
(74) *Attorney, Agent, or Firm*—Cantor Colburn LLP

(57) ABSTRACT

A semiconductor nanocrystal, wherein the semiconductor nanocrystal shows maximum luminescence peaks at two or more wavelengths and most of the atoms constituting the nanocrystal are present at the surface of the nanocrystal to form defects.

10 Claims, 7 Drawing Sheets
(5 of 7 Drawing Sheet(s) Filed in Color)

U.S. PATENT DOCUMENTS

| | | | |
|---|---|---|---|
| 7,238,331 B2 * | 7/2007 | Zhou et al. ..................... | 423/1 |
| 7,468,168 B2 | 12/2008 | Jang et al. | |
| 2006/0062720 A1 | 3/2006 | Jang et al. | |
| 2008/0268248 A1 | 10/2008 | Jang et al. | |

OTHER PUBLICATIONS

Japanese Office Action for Application No. 2005-157791 dated Oct. 19, 2010 citing above JP ref.

* cited by examiner

METHOD OF PREPARING CADMIUM SULFIDE NANOCRYSTALS EMITTING LIGHT AT MULTIPLE WAVELENGTHS, AND CADMIUM SULFIDE NANOCRYSTALS PREPARED BY THE METHOD

This non-provisional application is a continuation-in-part of Ser. No. 12/219,434, filed on Jul. 22, 2008, now U.S. Pat. No. 7,658,905, which is a continuation of Ser. No. 11/002,490, filed Dec. 3, 2004, now U.S. Pat No. 7,468,168, which claims priority under 35 U.S.C. §119(a) on Korean Patent Application No. 2004-38392 filed on May 28, 2004, which are all herein expressly incorporated by reference in their entirety.

BACKGROUND OF THE INVENTION

1. Field of the Invention

The present invention relates to a method for preparing cadmium sulfide nanocrystals emitting light at multiple wavelengths, and cadmium sulfide nanocrystals prepared by the method. More particularly, the present invention relates to a method for preparing cadmium sulfide nanocrystals by mixing a cadmium precursor and a dispersant in a solvent that weakly coordinates to the cadmium precursor, heating the mixture to obtain a cadmium precursor solution, dissolving a sulfur precursor in a solvent that weakly coordinates to the sulfur precursor to obtain a sulfur precursor solution, feeding the sulfur precursor solution to the heated cadmium precursor solution maintained at a high temperature to prepare cadmium sulfide crystals, and growing the cadmium sulfide crystals; and cadmium sulfide nanocrystals prepared by the method. The cadmium sulfide nanocrystals thus prepared can emit light close to white light at different wavelengths corresponding to transitions from various energy levels.

2. Description of the Related Art

When a semiconductor material is prepared into nano-sized crystals (nanocrystals), quantum confinement effects are exhibited in the range smaller than the bulk exciton Bohr radius of the semiconductor material. Due to quantum confinement effects, the band gap energies characteristic to the semiconductor material are changed. When a semiconductor material capable of emitting visible light is prepared into nanocrystals, the band gap energies of the semiconductor material begin to increase as the semiconductor material decreases in size down to a particular size, which results in a blue shift wherein the luminescent region is shifted toward the blue region is observed. Since the control over the characteristics, structure, shape, and size of a quantum dot material enables the control of the corresponding band gaps, energy levels over a very broad range of wavelengths can be obtained.

In this connection, recent attention has been directed toward techniques for controlling the growth of quantum dots in order to develop new concepts of semiconductor devices. In particular, conventional vapor deposition processes, including MOCVD (metal organic chemical vapor deposition) and MBE (molecular beam epitaxy), are suitable for use in controlling semiconductor thin films to a level corresponding to a single atomic layer and controlling the growth of quantum dots. However, since quantum dots prepared by vapor deposition using the phenomenon of lattice mismatch have serious drawbacks in the control of their size, uniformity, density, etc., despite their good crystallinity, it is known to one skilled in the art that vapor deposition processes are inappropriate for the fabrication of commercially viable devices.

U.S. Pat. No. 6,225,198 discloses a process for preparing semiconductor quantum dots using a Group II-VI compound. According to this process, the semiconductor quantum dots are prepared by dissolving a material containing a Group II metal (e.g., Zn, Cd, or Hg) and a material containing a Group VI element (e.g., S, Se, or Te), as precursors, in first and second dispersant solutions, respectively, mixing the solutions, adding a solvent capable of dissolving both the precursors to the mixture, preparing Group II-VI compound semiconductor crystals while maintaining a temperature for crystal growth, growing the Group II-VI compound semiconductor crystals to a desired size, and separating the grown compound semiconductor crystals. The nanocrystals thus prepared have different energy band gaps according to their size, due to quantum confinement effects. Particularly, nanocrystals with inorganic material characteristics emit pure light in the corresponding energy region.

U.S. Pat. No. 6,306,736 discloses a process for preparing Group II-VI semiconductor quantum dots by utilizing the process disclosed in U.S. Pat. No. 6,225,198.

Core-shell structured quantum dot materials exhibiting improved luminescence efficiency, and a method for preparing the quantum dot materials are disclosed in U.S. Pat. Nos. 6,322,901 and 6,207,229, respectively. The core-shell structured quantum dots are reported to have improved luminescence efficiency by 30~50%. The prior art techniques state that the quantum dots are of interest for use in displays and biological imaging sensors, based on the phenomenon that energy transitions in quantum dots mainly take place at the edge of energy band gaps. According to the prior art, in order to produce white light at different wavelengths, various luminescent nanocrystals having a different size or composed of materials emitting light over a broad range of wavelengths should be mixed, followed by photoluminescence. Thus, there exists a strong need for a method for preparing nanocrystals capable of emitting light over a broad range of wavelengths (at multiple wavelengths), without mixing of various nanocrystals emitting light at different wavelengths.

SUMMARY OF THE INVENTION

Therefore, the present invention has been made in view of the above problems, and it is an object of the present invention to provide a method for preparing cadmium sulfide nanocrystals having uniform size and shape and capable of emitting light at multiple wavelengths, without mixing various nanocrystals emitting light at different wavelengths.

It is another object of the present invention to provide cadmium sulfide nanocrystals prepared by the method.

It is yet another object of the present invention to provide an organic electroluminescent device comprising the nanocrystals emitting light at multiple wavelengths prepared by the method.

In accordance with one aspect of the present invention, the above objects can be accomplished by a method for preparing cadmium sulfide nanocrystals comprising the steps of: (a) mixing a cadmium precursor and a dispersant in a solvent that weakly coordinates to the cadmium precursor, and heating the mixture to obtain a cadmium precursor solution; (b) dissolving a sulfur precursor in a solvent that weakly coordinates to the sulfur precursor to obtain a sulfur precursor solution; and (c) feeding the sulfur precursor solution to the heated cadmium precursor solution maintained at a high temperature to prepare cadmium sulfide crystals, and growing the cadmium sulfide crystals.

In accordance with another aspect of the present invention, there are provided cadmium sulfide nanocrystals prepared by the method.

In accordance with yet another aspect of the present invention there is provided a white light-emitting diode (LED) device comprising the cadmium sulfide nanocrystals prepared by the method.

BRIEF DESCRIPTION OF THE DRAWINGS

The patent or application file contains at least one drawing executed in color. Copies of this patent or patent application publication with color drawing(s) will be provided by the U.S. Patent and Trademark Office upon request and payment of the necessary fee.

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
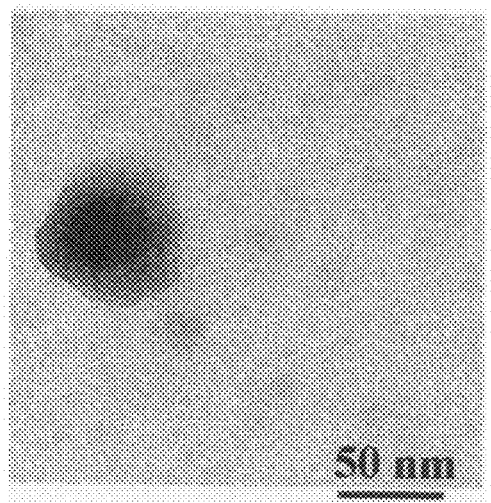
FIG. 1 is a transmission electron micrograph (TEM) (scale bar=50 nm) of cadmium sulfide nanocrystals prepared in Example 1 of the present invention.

The present invention is directed to a method for preparing cadmium sulfide nanocrystals, which are zero-dimensional quantum dot materials emitting light at multiple wavelengths, by controlling the coordination of the solvents to the precursors used.

Specifically, the method of the present invention comprises the steps of:

(a) mixing a cadmium precursor and a dispersant in a solvent that weakly coordinates to the cadmium precursor, and heating the mixture to obtain a cadmium precursor solution;

(b) dissolving a sulfur precursor in a solvent that weakly coordinates to the sulfur precursor to obtain a sulfur precursor solution; and (c) feeding the sulfur precursor solution to the heated cadmium precursor solution maintained at a high temperature to prepare cadmium sulfide crystals, and growing the cadmium sulfide crystals.

Embodiments of the method of the present invention are specifically explained based on the respective steps in the following.

In step (a), a homogeneous cadmium precursor solution is obtained by mixing a cadmium-containing compound, as a cadmium precursor for forming cadmium sulfide crystals, and a dispersant in a solvent that weakly coordinates to the cadmium precursor, and heating the mixture while stirring and maintaining the mixture at a constant pressure under nitrogen or argon atmosphere to avoid the generation of a temperature gradient in the mixture.

The cadmium precursor is a relatively stable material in air and generates no toxic gas in the subsequent feeding step. As the cadmium precursor, there may be used, for example, an oxide, a halide or an organic complex of cadmium can be used. Specific examples of cadmium precursors include, but are not limited to, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphide, cadmium sulfate, and mixtures thereof.

The dispersant to be mixed with the cadmium precursor is a material capable of reacting with the cadmium precursor to form a cadmium complex. The coordination ability and the growth rate at a particular crystal plane can be determined depending on the kind and the concentration of the dispersant used. Accordingly, the choice of the dispersant is an important factor affecting the size and shape of the semiconductor nanocrystals to be prepared.

Examples of dispersants usable in the present invention include weakly acidic organic compounds, for example, $C_{2-18}$ alkyl carboxylic acids, $C_{2-18}$ alkenyl carboxylic acids, $C_{2-18}$ alkyl phosphonic acids, $C_{2-18}$ alkyl sulfonic acids, and $C_{2-18}$ alkenyl sulfonic acids; and weakly basic organic compounds, for example, $C_{2-18}$ alkyl amines, and $C_{2-18}$ alkenyl amines. Specific examples of dispersants are oleic acid, stearic acid, palmitic acid, hexyl phosphonic acid, n-octyl phosphonic acid, tetradecyl phosphonic acid, octadecyl phosphonic acid, n-octyl amine, hexadecyl amine, and oleyl amine.

For better stabilization of the metal or metal precursor, easy control of the reaction rate and narrow size distribution of the nanocrystals to be prepared, the molar ratio of the cadmium precursor to the dispersant is preferably adjusted between 1:0.1 and 1:100, more preferably between 1:1 and 1:20, and still more preferably between 1:2 and 1:8, but is not limited to these ranges.

Solvents to be mixed with the cadmium precursor and the dispersant should preferably contain few impurities, be present in liquid phase at room temperature and be very weak in coordination intensity. The use of such weakly coordinating solvents is advantageous because most of the precursor particles form nuclei due to their high nucleation rate, inhibiting the growth of crystals, and as a result, nanocrystals having a size of 3 nm or less can be prepared at high concentration. Therefore, the weakly coordinating solvent used herein preferably is a solvent that has reduced binding ability to cadmium, which maintains the reaction rate between sulfur and cadmium at a high level, and which also does not coordinate on the surface of the nanocrystals which are prepared after the reaction.

Particular examples of weakly coordinating solvents that can be used in the present invention include $C_{6-22}$ primary alkyl amines, $C_{6-22}$ secondary alkyl amines, $C_{6-22}$ tertiary alkyl amines, $C_{6-22}$ nitrogen-containing heterocyclic compounds, $C_{6-22}$ sulfur-containing heterocyclic compounds, $C_{6-22}$ alkanes, $C_{6-22}$ alkenes, $C_{6-22}$ alkynes, and the like.

Specific examples of the primary alkyl amines include, for example, dodecyl amine, hexadecyl amine, and dimethyldodecyl amine. Specific examples of the secondary and tertiary alkyl amines include, for example, dioctyl amine and trioctyl amine, respectively. Specific examples of the nitrogen-containing and sulfur-containing heterocyclic compounds include, for example, isopropyl-2,3-diphenylaziridine and dimethylsulfolane, respectively. Specific examples of the alkanes, alkenes and alkynes include, for example, octadecane, octadecene, and dodecyne, respectively.

Since the solvent should have appropriate coordination ability, an ability to disperse the nanocrystals to be prepared, and be stably present at high reaction temperature, it preferably has a carbon chain of a certain length. Solvents having about 6 to 22 carbon atoms are preferred. In addition, the reaction solvent must be able to dissolve the precursors that constitute the compound semiconductors to be prepared.

The mixing ratio of the cadmium precursor to the solvent is in the range of 0.1:1 to 1:100, preferably 0.5:1 to 1:40, and more preferably 1:1 to 1:20, on a molar basis. The final concentration of the cadmium precursor solution is in the range of 0.001M to 2M, preferably 0.005M to 0.5M, and more preferably 0.01M to 0.1M.

In step (a), a reaction mixture, which comprises the solvent, cadmium precursor, and the dispersant, is heated to 100~400° C. in order to dissolve the cadmium precursor and the dispersant and to homogenize the solution.

In order to allow the reaction to proceed under a relatively inert atmosphere, nitrogen or argon gas at a constant pressure is used. The reaction temperature is preferably maintained within the range defined above.

In step (b), a sulfur precursor solution is obtained by mixing a sulfur precursor in a solvent that weakly coordinates to the sulfur precursor, without the use of a dispersant, heating the mixture while stirring and maintaining the mixture at a constant pressure under nitrogen or argon atmosphere to avoid the generation of a temperature gradient in the mixture until the mixture is completely dissolved, and slowly cooling the solution to room temperature.

As the sulfur precursor, a sulfur powder, trimethylsilyl sulfur and/or alkyl thiol, is used. Examples of solvents used to dissolve the sulfur precursor include those used to obtain the cadmium precursor solution, and preferably solvents having little or no coordination to the sulfur precursor, such as alkanes, alkenes and alkynes, and solvents having weak coordination to the sulfur precursor, such as alkyl amines, nitrogen-containing heterocyclic compounds and sulfur-containing heterocyclic compounds. Except for the disclosed variations, the procedure for obtaining the cadmium precursor solution is applied to that for obtaining the sulfur precursor solution. Since no dispersant is used to obtain the sulfur precursor solution and the solvent used has a weak coordination to the sulfur precursor, the nucleation rate may be increased, affecting the preparation of the nanocrystals to be prepared.

In order to maintain the yield of the nanocrystals at a constant level and to reduce the size distribution of the nanocrystals, the final concentration of the sulfur precursor solution is preferably adjusted to 0.001M~2M, and more preferably 0.01~0.5M, but is not limited to these ranges.

The reaction for dissolution of the sulfur precursor to obtain the sulfur precursor solution is preferably performed between room temperature and 100° C. Thereafter, stirring is continuously carried out until the solution turns transparent yellow, and then the solution is allowed to cool to room temperature.

In step (c), the sulfur precursor solution at room temperature obtained in step (b) is quickly fed to the heated cadmium precursor solution at a high temperature obtained in step (a), reacted for a certain time period with stirring, cooled to room temperature as rapidly as possible after completion of the reaction, and centrifuged to separate precipitates to generate cadmium sulfide nanocrystals having a size of 3 nm or less.

For easy crystal growth and ensured stability of the solvents used, the reaction between the two precursor solutions is preferably performed in the temperature range of 50° C.~400° C., more preferably 200° C.~350° C., and even more preferably 250° C.~350° C.

In the preparation of the cadmium sulfide nanocrystals, the reaction between the two precursor solutions is preferably performed for 1 second to 10 hours, more preferably for 10 seconds to 5 hours, and even more preferably for 30 seconds to 2 hours. Within these time ranges, the reaction rate can be easily controlled.

The present invention is also directed to cadmium sulfide nanocrystals prepared by the method. Since the cadmium sulfide nanocrystals prepared by the method are 3 nm or less, and preferably 1 nm~3 nm in size, most atoms constituting the nanocrystals are present at the surface rather than inside the nanocrystals. Accordingly, the atoms present at the surface of the nanocrystals have a chemically unstable coordination structure and a physically unstable lattice structure, unlike the atoms present inside the nanocrystals. Due to these unstable structures, the atoms present at the surface of the nanocrystals form defects and adversely affect the energy band structure, thus forming traps. Particularly, in the case of nanocrystals emitting pure light, the light emission mainly takes place due to energy transitions arising at the edge of energy band gaps. The presence of traps in the cadmium sulfide nanocrystals of the present invention causes a decrease in luminescence efficiency or a drop in color purity. As the size of nanocrystals becomes smaller, the proportion of luminescence generated in the traps increases. In this case, light at different wavelengths is mixed according to many different energy transitions, thus emitting white light. In addition, since energy levels of shallow or deep traps formed by the presence of defects are influenced by the energy band edge of nanocrystals, the control of the energy band through size control of the nanocrystals changes the energy levels of the traps. As a result, even nanocrystals emitting light close to white light enable expression of various colors, depending on the size and structure of the nanocrystals. Further, the white light-emitting cadmium sulfide nanocrystals are expected to have a utility value in displays and illuminators.

The shape of the cadmium sulfide nanocrystals may be a sphere, rod, tripod, tetrapod, cube, box or star, but is not limited thereto.

The cadmium sulfide nanocrystals emit light in the wavelength range of 300 nm to 800 nm. The cadmium sulfide nanocrystals exhibit some luminescence peaks at wavelengths within 300 nm~800 nm, and emit white light while showing a broad spectrum over the entire visible range. The luminescence efficiency of the white light-emitting cadmium sulfide nanocrystals is 1% or more, and preferably 10% or more.

Particularly, the white light-emitting cadmium sulfide nanocrystals show maximum luminescence peaks at two or more wavelengths. One of the luminescence peaks is observed at a wavelength of 300 nm to 450 nm, corresponding to the energy band edge at which energy transitions in the nanocrystals take place. In addition, one or more luminescence peaks are observed at wavelengths of 400 nm to 800 nm, corresponding to transitions arising at energy levels of traps present in the energy band of the nanocrystals. The full width half maximum (FWHM) of the luminescence peaks is preferably 10~100 nm.

The size distribution of the cadmium sulfide nanocrystals is 20% or less, preferably 10% or less, and more preferably 5% or less. When the size distribution exceeds 20%, there is a problem of non-uniform luminescence wavelengths.

It is preferable that the atomic ratio of sulfur to cadmium in the cadmium sulfide nanocrystals is between 1:1 and 1:0.6.

The cadmium sulfide nanocrystals of the present invention, which emit white light at multiple wavelengths, can be utilized in various applications, such as displays, sensors, and energy devices, and are particularly useful to form a luminescent layer of a white light-emitting device.

The present invention is also directed to white light-emitting diode devices comprising the cadmium sulfide nanocrystals. Specifically, the white light-emitting cadmium sulfide nanocrystals of the present invention are characterized in that they are used as fluorescent substances for UV light-emitting diode devices.

The process of applying the white light-emitting cadmium sulfide nanocrystals as fluorescent substances for UV light-emitting diode devices can be carried out in a similar manner to that of typical inorganic fluorescent substances. The UV light-emitting diode devices can be fabricated by common fabrication techniques of light-emitting diode devices.

Also, the process of applying the white light-emitting cadmium sulfide nanocrystals as light-emitting layer for electroluminescent device can be carried out in a manner such as the printing method, coating method or ink-jet method. And the cadmium sulfide nanocrystals can be used in combination with an organic layer to form an organic electroluminescent device, in which organic layers are formed in an electron transport layer or a hole transport layer, but not in a luminescent layer, using organic compound.

The organic electroluminescent device has a structure selected from anode/luminescent layer/cathode, anode/buffer layer/luminescent layer/cathode, anode/hole transport layer/luminescent layer/cathode, anode/buffer layer/hole transport layer/luminescent layer/cathode, anode/buffer layer/hole transport layer/luminescent layer/electron transport layer/cathode, and anode/buffer layer/hole transport layer/luminescent layer/hole blocking layer/electron injecting layer/cathode, but is not particularly limited to these structures.

As materials for buffer layer, compounds commonly used in the art for this purpose can be used. Preferred examples include, but are not limited to, copper phthalocyanine, polythiophene, polyaniline, polyacetylene, polypyrrole, polyphenylene vinylene and derivatives thereof. As materials for the hole transport layer, compounds commonly used in the art for this purpose can be used. The preferred examples include, but are not limited to, poly(3,4-ethylenediophene)/polystyrene parasulfonate derivatives, poly-N-vinylcarbazole derivatives, polyphenylenevinylene derivatives, polymethaacrylate derivatives, poly(9,9-octylfluorene) derivatives, polytriphenylamine derivatives, N,N'-diphenyl-N,N'-bis(3-methylphenyl)-(1,1'-biphenyl)-4,4'-diamine. As materials for the electron transport layer, compounds commonly used in the art for this purpose can be used. Preferred examples include, but are not limited to, polyoxadiazole or tris-8-hydroxyquinoline)aluminum can be used. As materials for the hole blocking layer, compounds commonly used in the art for this purpose can be used. Preferred examples include, but are not limited to, 3-(4-biphenylyl)-4-phenyl-5-t-butylphenyl-1,2,4-triazole can be used. As materials for electron injecting layer, compounds commonly used in the art for this purpose can be used. Preferred examples include, but are not limited to, LiF, BaF$_2$, MgF$_2$ and the like.

The organic-inorganic hybrid electroluminescent device of the present invention does not require particular manufacturing apparatuses or methods and can be manufactured using materials commonly known in the art, in accordance with conventional manufacturing methods.

The present invention will now be described in more detail with reference to the following example. However, the example is not to be construed as limiting the scope of the invention.

EXAMPLE 1

Preparation of Cadmium Sulfide Nanocrystals, and Fabrication of White Light-Emitting Diode 16 g of octadecene, 2 g of oleic acid, and 0.4 mmol of cadmium oxide (CdO) as a cadmium precursor were simultaneously charged into a 100 ml flask equipped with a reflux condenser. The reaction mixture was heated to 300° C. while stirring and maintaining the mixture under nitrogen atmosphere at a constant pressure to avoid the generation of a temperature gradient in the mixture. The heated reaction mixture was steadily stirred at the same temperature until the original color (red) of the cadmium oxide became transparent.

Separately, a sulfur powder as a sulfur precursor was added to octadecene, and then the resulting reaction mixture was heated to 250° C. using a heating mantle while stirring and maintaining the mixture under nitrogen atmosphere at a constant pressure to avoid the generation of a temperature gradient in the mixture. The heated reaction mixture was steadily stirred at the same temperature until the color of the powder sulfur changed to transparent yellow. At this time, the concentration of the sulfur precursor solution was adjusted to about 0.25M. When the sulfur powder completely disappeared and its color became transparent yellow, the stirring was stopped. The transparent solution was slowly cooled to room temperature. 2.5 ml of the sulfur precursor solution was fed rapidly to the previously obtained cadmium precursor solution maintained at 300° C., and then the resulting reaction mixture was reacted for about 4 minutes with stirring. After completion of the reaction, the reaction mixture was cooled to room temperature as rapidly as possible by removal of the heating mantle, followed by addition of ethanol for quenching. The cooled reaction solution was centrifuged. The precipitates were separated by decanting the solution, and dispersed in toluene for storage. The analytical results of the cadmium sulfide nanocrystals are shown in FIGS. 1 to 7.

Figure 2:
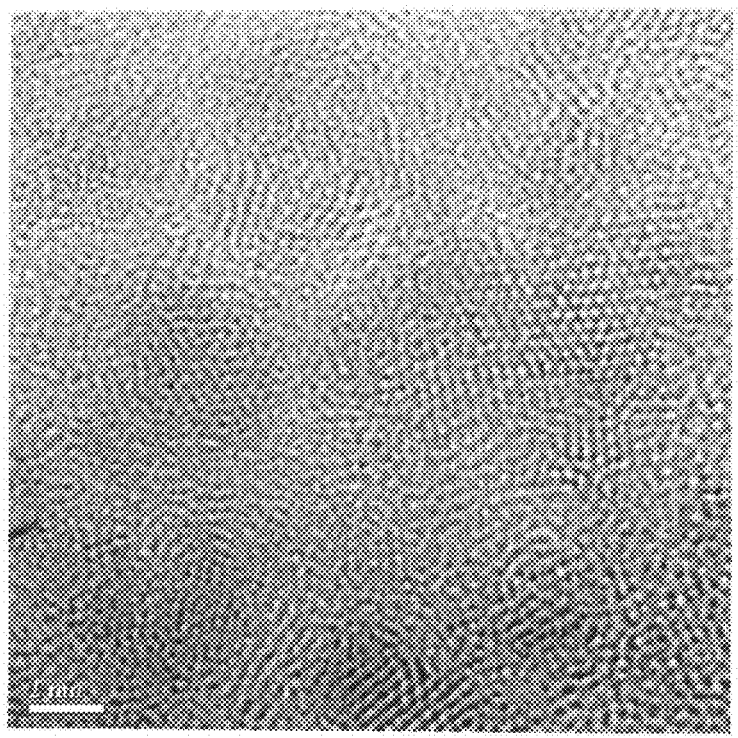
FIG. 2 is a high-resolution transmission electron micrograph (HR-TEM) (scale bar=2 nm) of cadmium sulfide nanocrystals prepared in Example 1 of the present invention.
Figure 3:
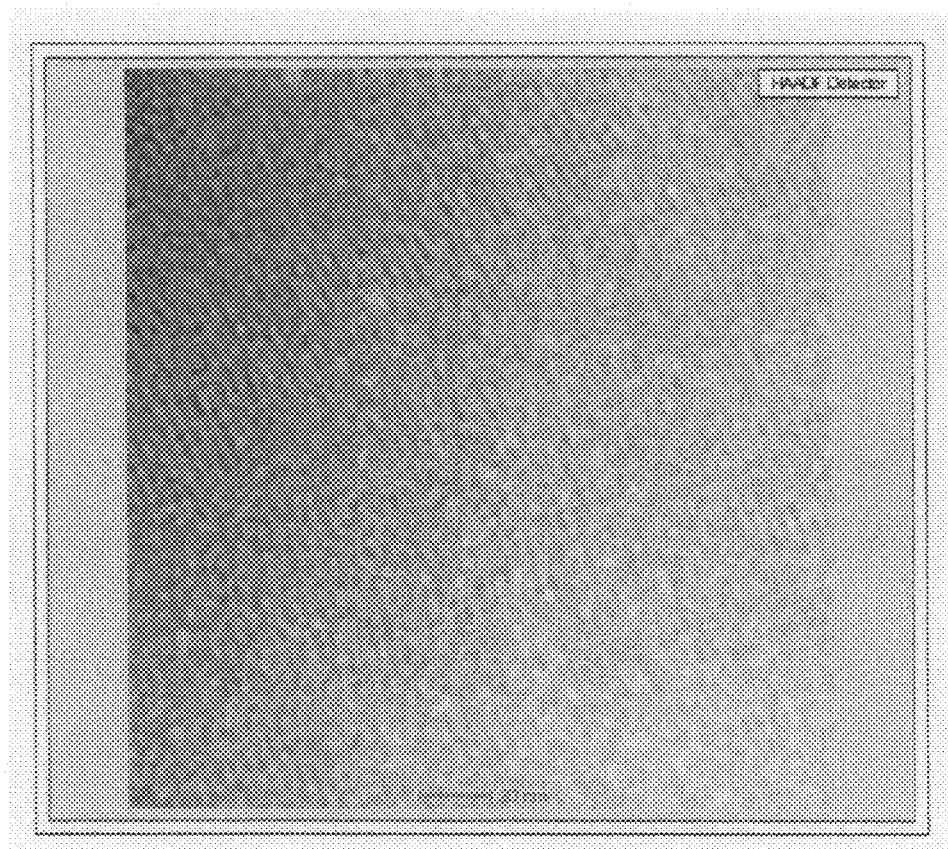
FIG. 3 is a scanning transmission electron micrograph (STEM) (scale bar=20 nm) of cadmium sulfide nanocrystals prepared in Example 1 of the present invention.
Figure 4:
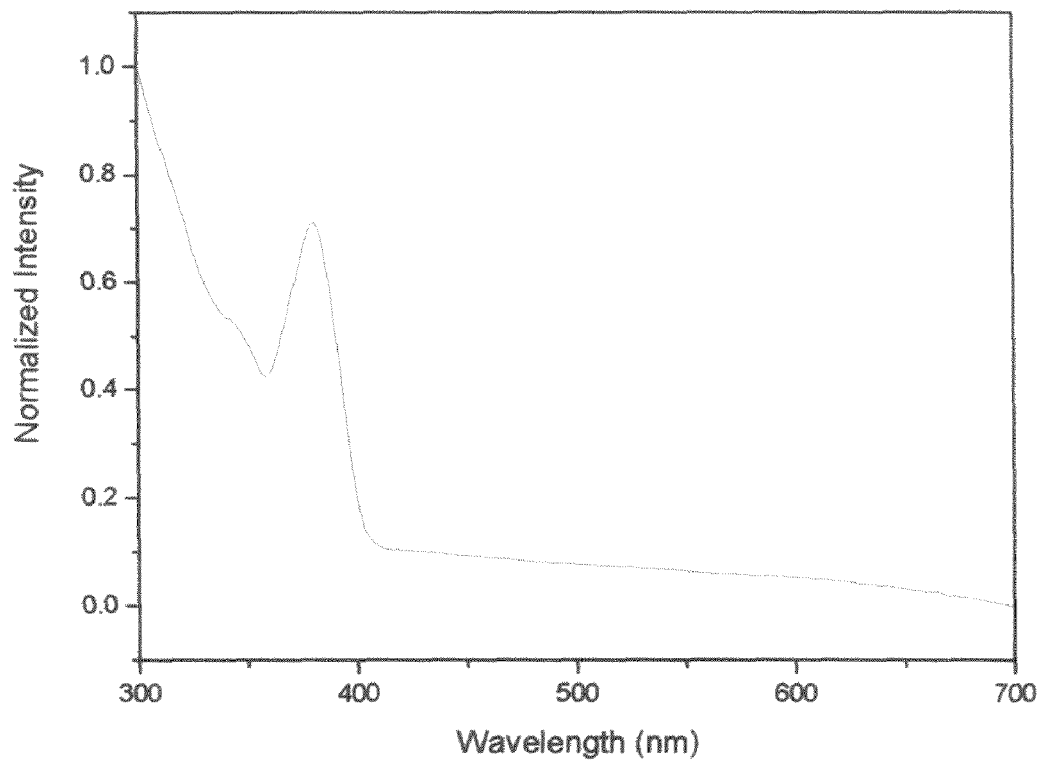
FIG. 4 is a UV absorption spectrum of cadmium sulfide nanocrystals prepared in Example 1 of the present invention.
Figure 5:
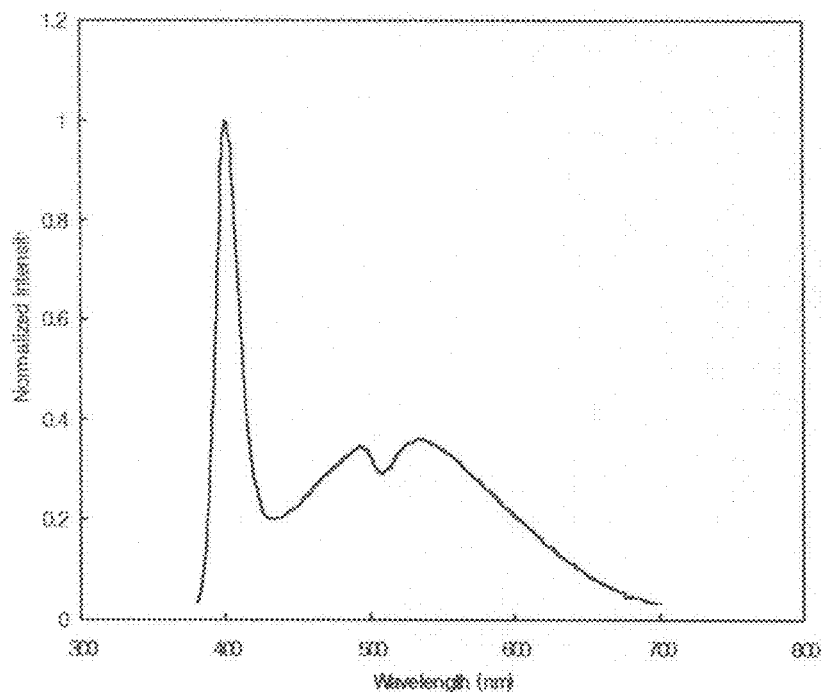
FIG. 5 is a photoluminescence spectrum of cadmium sulfide nanocrystals prepared in Example 1 of the present invention.
Figure 6:
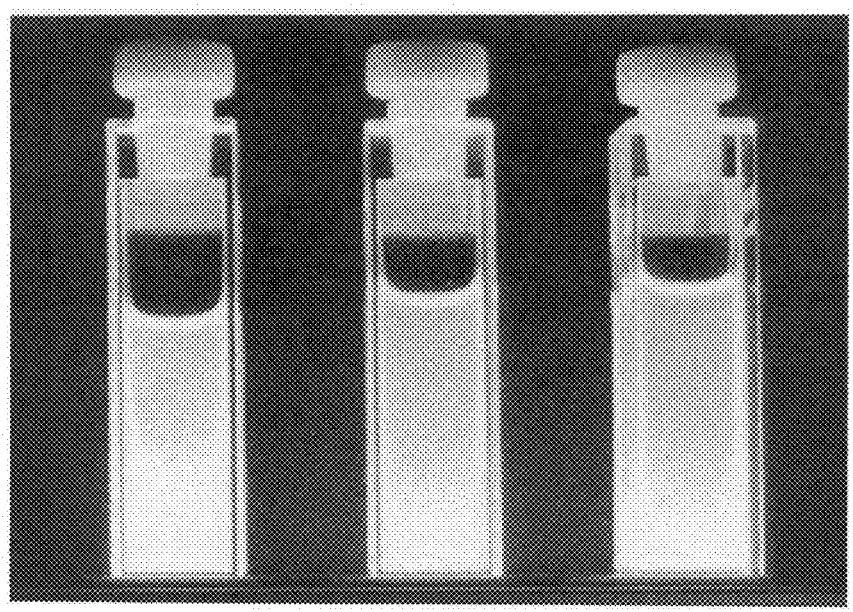
FIG. 6 is a photograph of cadmium sulfide nanocrystals prepared in Example 1 of the present invention, taken under a UV lamp at 365 nm.
Figure 7:
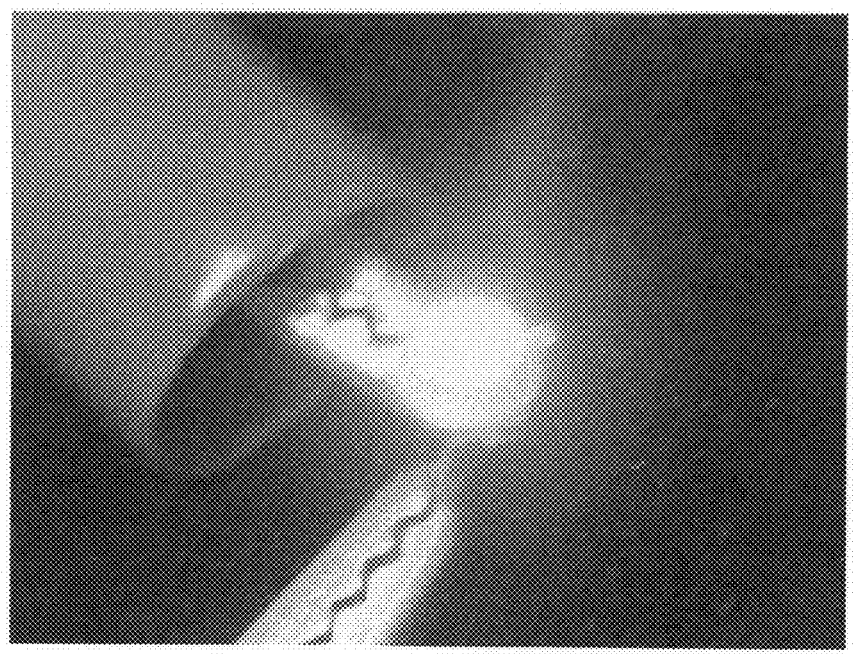
FIG. 7 is a photograph taken after molding cadmium sulfide nanocrystals prepared in Example 1 of the present invention on a UV LED, followed by photoluminescence.

FIG. 1 is a transmission electron micrograph of the cadmium sulfide nanocrystals prepared in Example 1 of the present invention. It can be confirmed from FIG. 1 that the nanocrystals agglomerate to form a large lump during drying. FIG. 2 is a high-resolution transmission electron micrograph of the cadmium sulfide nanocrystals. As can be seen from FIG. 2, the cadmium sulfide nanocrystals have a uniform crystal structure. FIG. 3 is a scanning transmission electron micrograph of the cadmium sulfide nanocrystals. As is apparent from FIG. 3, the cadmium sulfide nanocrystals have very uniform size and shape. In addition, the cadmium sulfide nanocrystals are uniformly aligned, like a super lattice structure. FIG. 4 is a UV absorption spectrum of the cadmium sulfide nanocrystals. The spectrum indicates that the nanocrystals are excited by a certain wavelength of light FIG. 5 is a photoluminescence spectrum of the cadmium sulfide nanocrystals. Sharp and broad luminescence peaks are observed at 400 nm, 500 nm and 550 nm in the spectrum. From the spectrum, energy levels and luminescence efficiency of the nanocrystals can be determined. FIG. 6 shows the state of the solutions of the cadmium sulfide nanocrystals under a UV lamp at 365 nm. The photograph shows that light at different wavelengths is mixed to produce white light FIG. 7 is a photograph showing the luminescent state after mixing the cadmium sulfide nanocrystals with a packaging material of a diode emitting light at 400 nm, molding the mixture to fabricate a diode, and flowing an electric current through the diode. The photograph of FIG. 7 shows that the diode emits white light.

EXAMPLE 2

Preparation of InZnP Nanocrystals 0.4 mmol (0.116 g) of Indium acetate, 0.2 mmol of zinc acetate, 1.6 mmol (0.408 g) of plamitic acid and 20 ml of octadecene were simultaneously charged into a three neck flask. The reaction mixture was heated to 120° C. while stirring under vacuum condition and was reacted for about one hour. The heated reaction mixture was cooled to a room temperature. A solution of 0.4 mmol (105.6 µl) of tris(trimethylsilyl)phosphate ((TMS)3P), 0.6 mmol (492 µl) of trioctyl phosphine (TOP) and 1.5 ml of octadecene was prepared and the solution was added to the cooled reaction mixture. The resulting reaction mixture was heated to 320° C. followed by quenching. The analytical results of the IZnP nanocrystals are shown in FIGS. 8 and 9.

Figure 8:
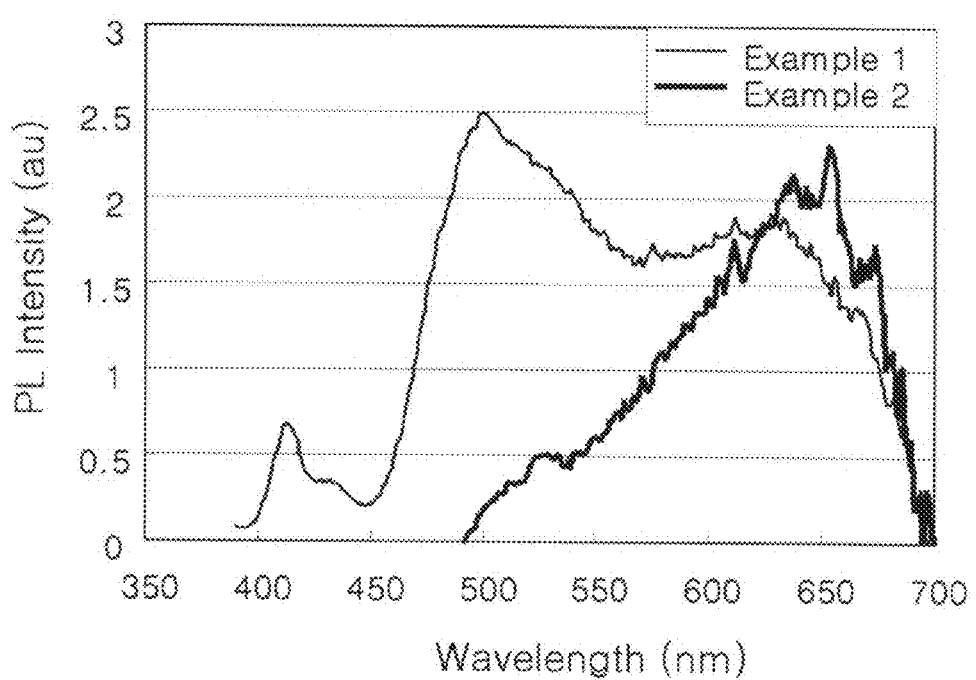
FIG. 8. is a photoluminesence spectrum of the InZnP nanocrystals.
Figure 8:
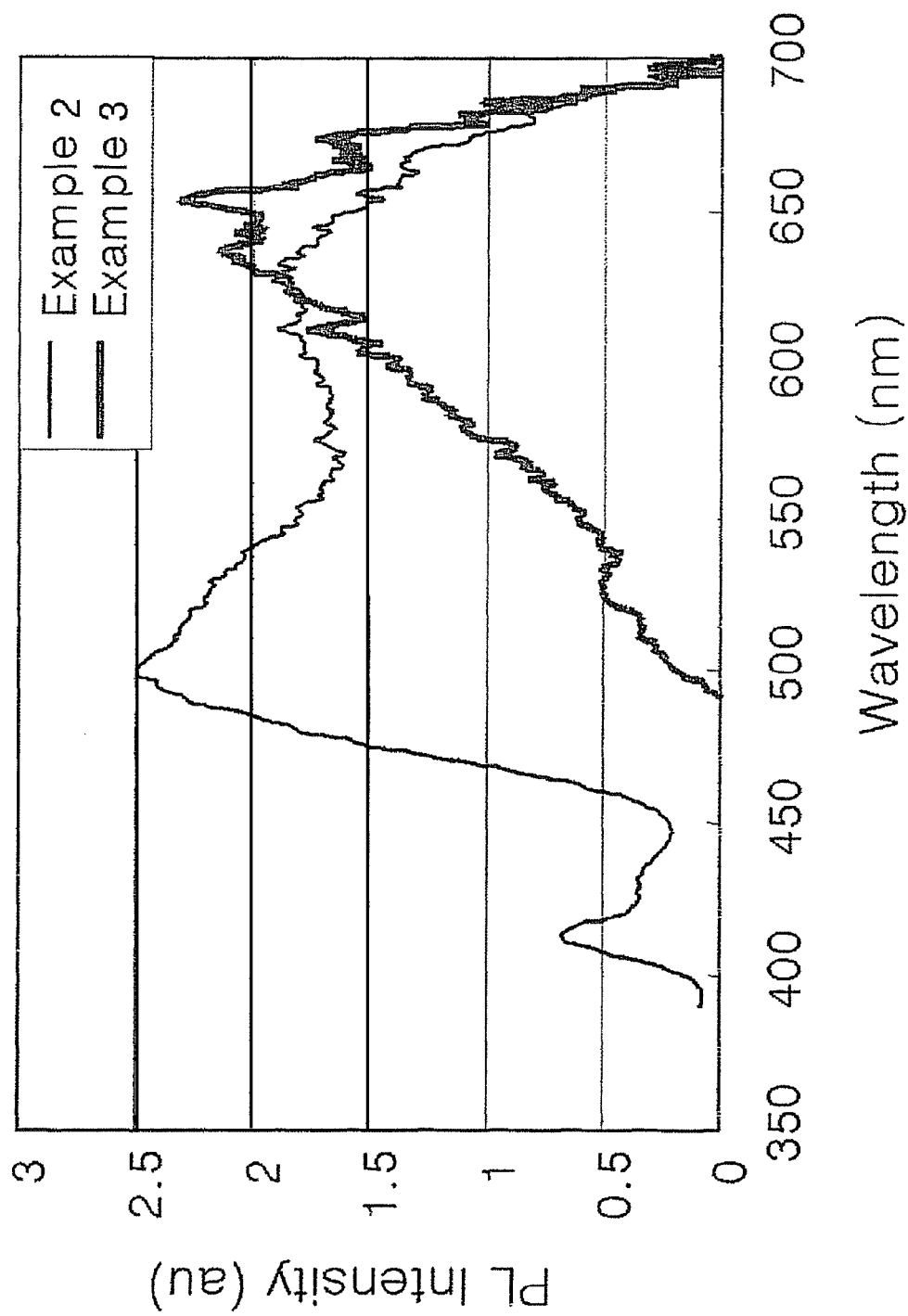
Figure 9:
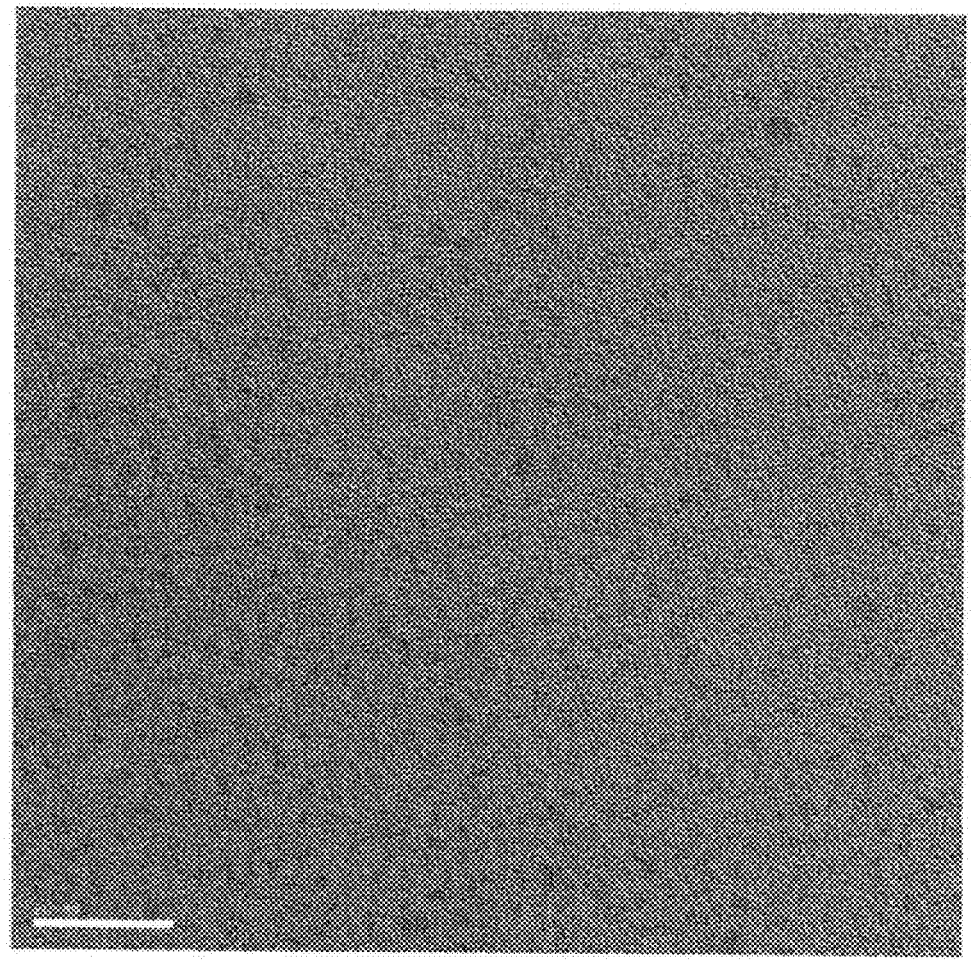
FIG. 9. is a high-resolution transmission electron micrograph of the InZnP nanocrystals.

FIG. 8 is a photoluminescence spectrum of the InZnP nanocrystals. Sharp and broad luminescence peaks are observed at 500 nm (band gap emission) and 630 nm (trap emission) in the spectrum. FIG. 9 is a high-resolution transmission electron micrograph of the InZnP nanocrystals. As can be seen from FIG. 9, the InZnP nanocrystals have a uniform crystal structure.

EXAMPLE 3

The process of Example 1 was repeated except that the reaction temperature was increased to 280° C. and was reacted for about thirty minutes to obtain InZnP nanocrystal. The photoluminescence spectrum of the obtained InZnP nanocrystals are shown in FIG. 8. As the reaction temperature was decreased, trap emission at 630 nm was increased compared to the trap emission of the Example 2.

As apparent from the above description, the present invention provides a method for preparing cadmium sulfide nanocrystals emitting light close to white light at multiple wavelengths. The method of the present invention enables the control of the nanocrystals to 3 nm or less in size, and as a result, allows the nanocrystals to emit white light at different wavelengths corresponding to transitions from various energy levels, as single crystals.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor nanocrystal, which is devoid of a cadmium sulfide nanocrystal, wherein semiconductor nanocrystal shows luminescence peaks at two or more wavelengths.

2. The semiconductor nanocrystal of claim 1, wherein traps present in the energy band of the nanocrystal and said semiconductor nanocrystal shows a luminescence peak at different wavelength when one or more traps generates one or more new energy level.

3. The semiconductor nanocrystal of claim 1, wherein the nanocrystal include defects on the surface thereof.

4. The semiconductor nanocrystal of claim 1, the nanocrystal is from about 1 nm to about 3 nm in size.

5. The cadmium sulfide nanocrystal of claim 3, wherein the nanocrystal emits white light.

6. The semiconductor nanocrystal of claim 1, the nanocrystal is comprised of at least one of a Group II-VI, Group II-VI, Group III-V, Group IV, Group IV-VI compounds, and mixtures thereof.

7. The semiconductor nanocrystal of claim 5, the nanocrystal is comprised of at least one of CdS, CdSe, CdTe, ZnS, ZnSe, ZnTe, HgS, HgSe, HgTe, PbS, PbSe, PbTe, AlN, AlP, AlAs, GaN, GaP, GaAs, InN, InP, InAs, C, Si, Ge, Sn, MgSe, InSe, InS, GaSe, GaS and a mixture thereof.

8. A light emitting device comprising the semiconductor nanocrystal of claim 1.

9. The light emitting device of claim 8, the device is a light emitting diode.

10. The light emitting device of claim 8, the device is an electroluminescence device.

* * * * *